(12) United States Patent
Moskowitz et al.

(10) Patent No.: US 8,600,043 B2
(45) Date of Patent: Dec. 3, 2013

(54) LOCKING MECHANISM FOR A COVER FOR A HOUSING OF AN ELECTRONIC DEVICE

(75) Inventors: Douglas Wayne Moskowitz, Weston, FL (US); Sophia Scipio, Sunrise, FL (US); Jean-Charles Mas, Sunrise, FL (US)

(73) Assignee: BlackBerry Limited, Waterloo, Ontario ( * ) Notice: Subject to any disclaimer, the term of this patent is extended or adjusted under 35 U.S.C. 154(b) by 643 days.

(21) Appl. No.: 12/831,531

(22) Filed: Jul. 7, 2010

(65) Prior Publication Data

US 2011/0005798 A1    Jan. 13, 2011

Related U.S. Application Data

(60) Provisional application No. 61/223,593, filed on Jul. 7, 2009.

(51) Int. Cl.
*H04M 1/00*    (2006.01)

(52) U.S. Cl.
USPC ...................................... 379/445; 379/433.11

(58) Field of Classification Search
USPC ........ 379/433.11; 455/575.1, 575.4; 292/163; 174/50; 429/97
See application file for complete search history.

(56) References Cited

U.S. PATENT DOCUMENTS

| | | | |
|---|---|---|---|
| 6,336,667 B1 | 1/2002 | Ford et al. | |
| 6,371,535 B2 | 4/2002 | Wei et al. | |
| 7,002,073 B2 | 2/2006 | Lai et al. | |
| 7,003,333 B2 | 2/2006 | Chow et al. | |
| 7,197,344 B2 | 3/2007 | Ahn et al. | |
| 7,205,475 B2 | 4/2007 | Jiang et al. | |
| 7,309,253 B2 | 12/2007 | Ge et al. | |
| 7,336,781 B2 | 2/2008 | Hu et al. | |
| 7,417,851 B2 | 8/2008 | Chen et al. | |
| 7,440,292 B2 | 10/2008 | Zhang et al. | |
| 7,441,813 B2 * | 10/2008 | Qin et al. | ...................... 292/163 |
| 7,442,464 B2 | 10/2008 | Li | |
| 7,465,516 B2 | 12/2008 | Nagura | |
| 7,495,899 B2 | 2/2009 | Liu et al. | |
| 7,510,250 B2 | 3/2009 | Lin et al. | |

(Continued)

FOREIGN PATENT DOCUMENTS

| | | |
|---|---|---|
| JP | 52 155925 U | 11/1977 |
| JP | 54 001126 U | 1/1979 |
| WO | WO 01/82825 A1 | 11/2001 |

OTHER PUBLICATIONS

Canadian Intellectual Property Office, Examiner's Report issued in Canadian application No. 2,708,968, dated Jul. 26, 2012, 3 pages.

*Primary Examiner* — Mohammad Islam
*Assistant Examiner* — Van D Huynh
(74) *Attorney, Agent, or Firm* — Hanley, Flight & Zimmerman, LLC.

(57) ABSTRACT

The disclosure relates to a housing for an electronic device. The housing comprises: a back housing defining an interior compartment of the device; a receptacle to receive a first locking feature from a cover for the electronic device; and at least one moveable second locking feature in the receptacle to engage the first locking feature to hold the cover to the back housing. In the back housing the second locking feature is selectively moved from a first engaged position with the first locking feature to a second disengaged position with the first locking feature when a predefined force is applied at a specific location at the back housing or the cover.

24 Claims, 12 Drawing Sheets

(56) References Cited

U.S. PATENT DOCUMENTS

| | | |
|---|---|---|
| 7,512,397 B2 | 3/2009 | Liu et al. |
| 7,520,540 B2 | 4/2009 | Lin et al. |
| 7,529,569 B2 | 5/2009 | Ahn et al. |
| 7,539,521 B2 * | 5/2009 | Nam .......................... 455/575.1 |
| 7,540,364 B2 | 6/2009 | Sanderson |
| 7,549,684 B2 | 6/2009 | Shi et al. |
| 7,550,226 B2 | 6/2009 | Qin et al. |
| 7,682,727 B2 * | 3/2010 | Hsu ................................ 429/97 |
| 8,148,633 B2 * | 4/2012 | Hung .............................. 174/50 |
| 2004/0012209 A1 | 1/2004 | Liu et al. |
| 2004/0130165 A1 | 7/2004 | Nurenberg et al. |
| 2008/0042448 A1 | 2/2008 | Ge et al. |
| 2008/0318646 A1 * | 12/2008 | Lin ............................ 455/575.4 |
| 2009/0108593 A1 | 4/2009 | Lee |
| 2009/0134636 A1 | 5/2009 | Lee |
| 2009/0140531 A1 | 6/2009 | Lee |
| 2009/0167061 A1 | 7/2009 | Lee |
| 2009/0168311 A1 | 7/2009 | Hung |

* cited by examiner

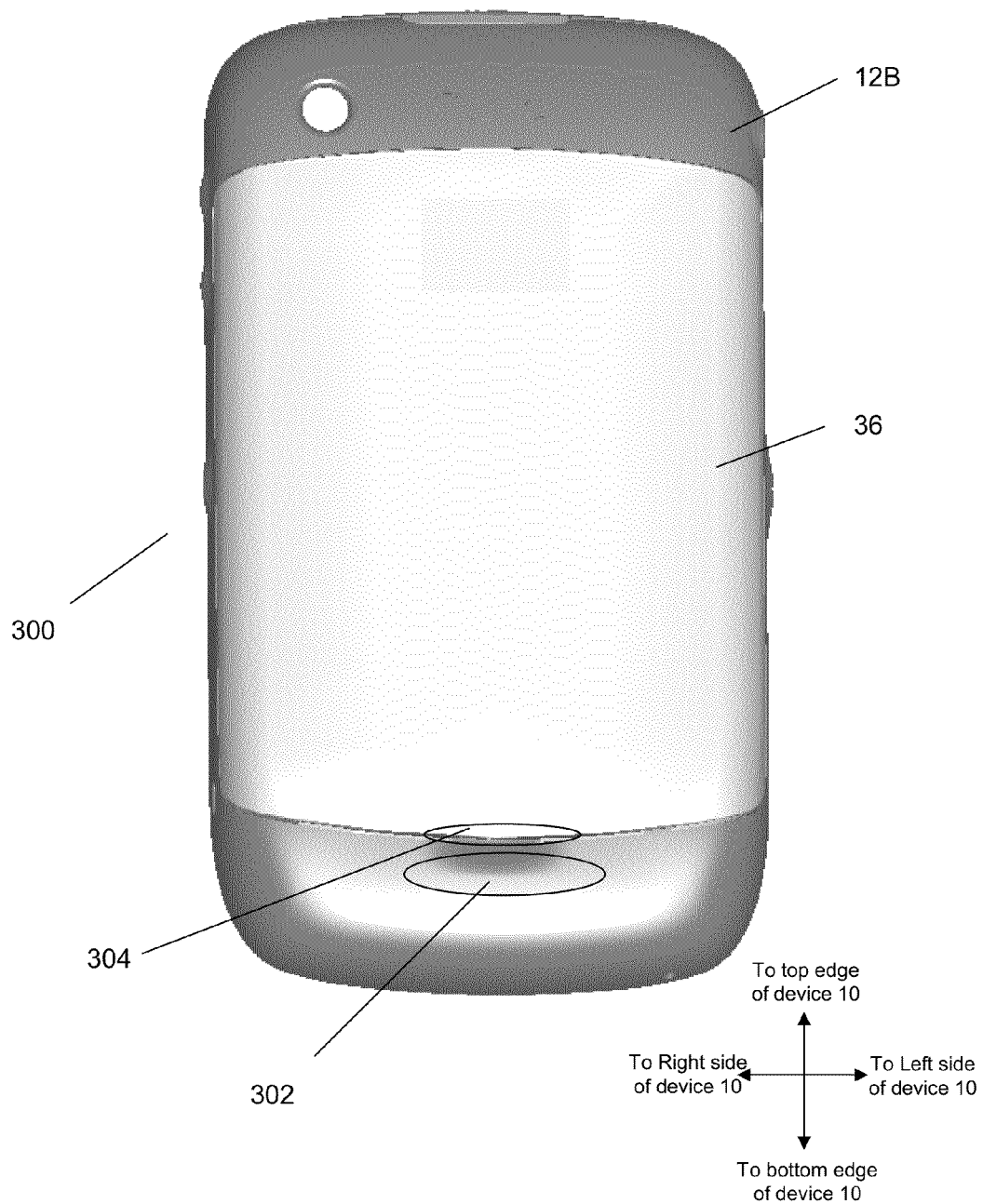

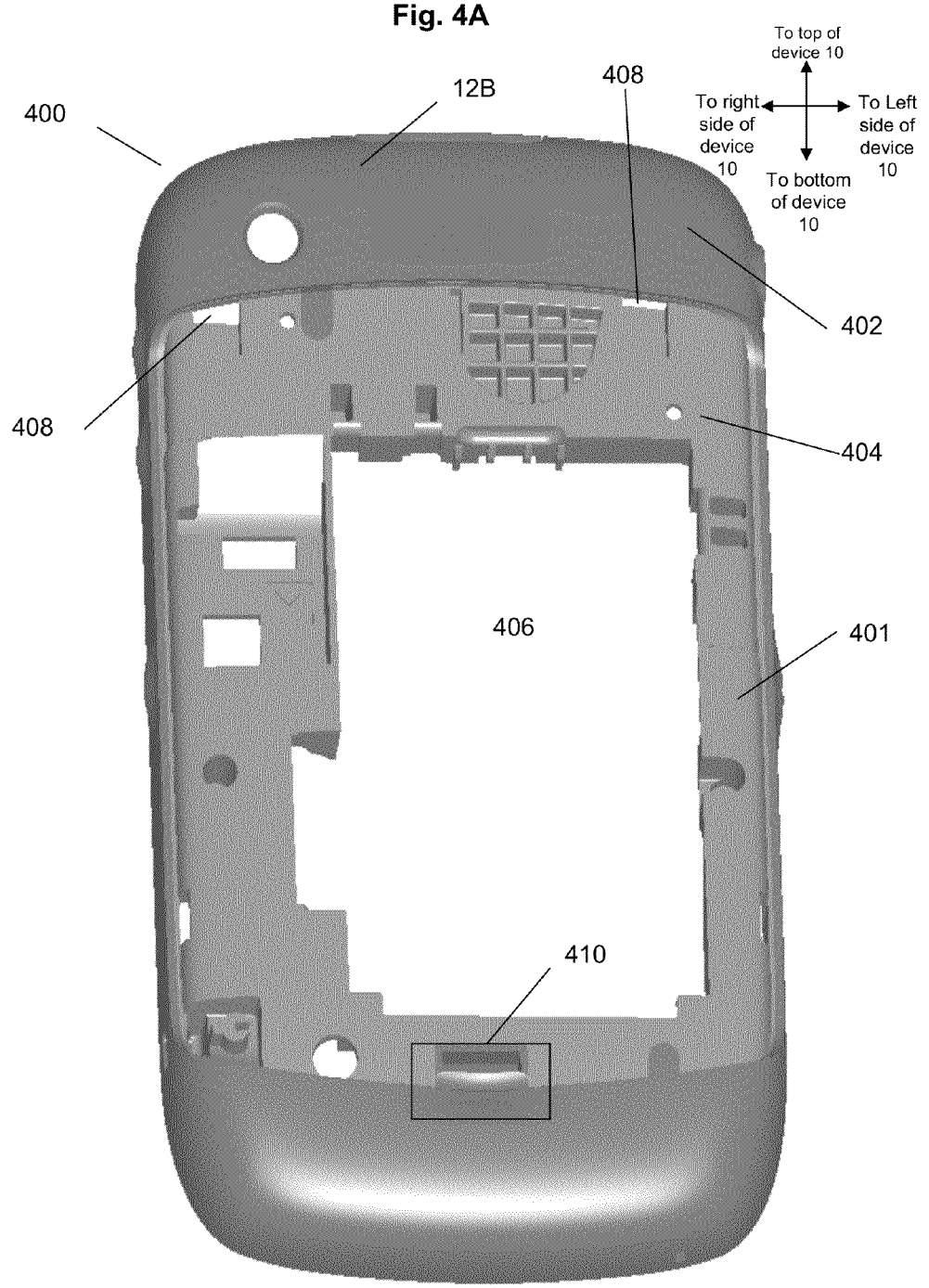

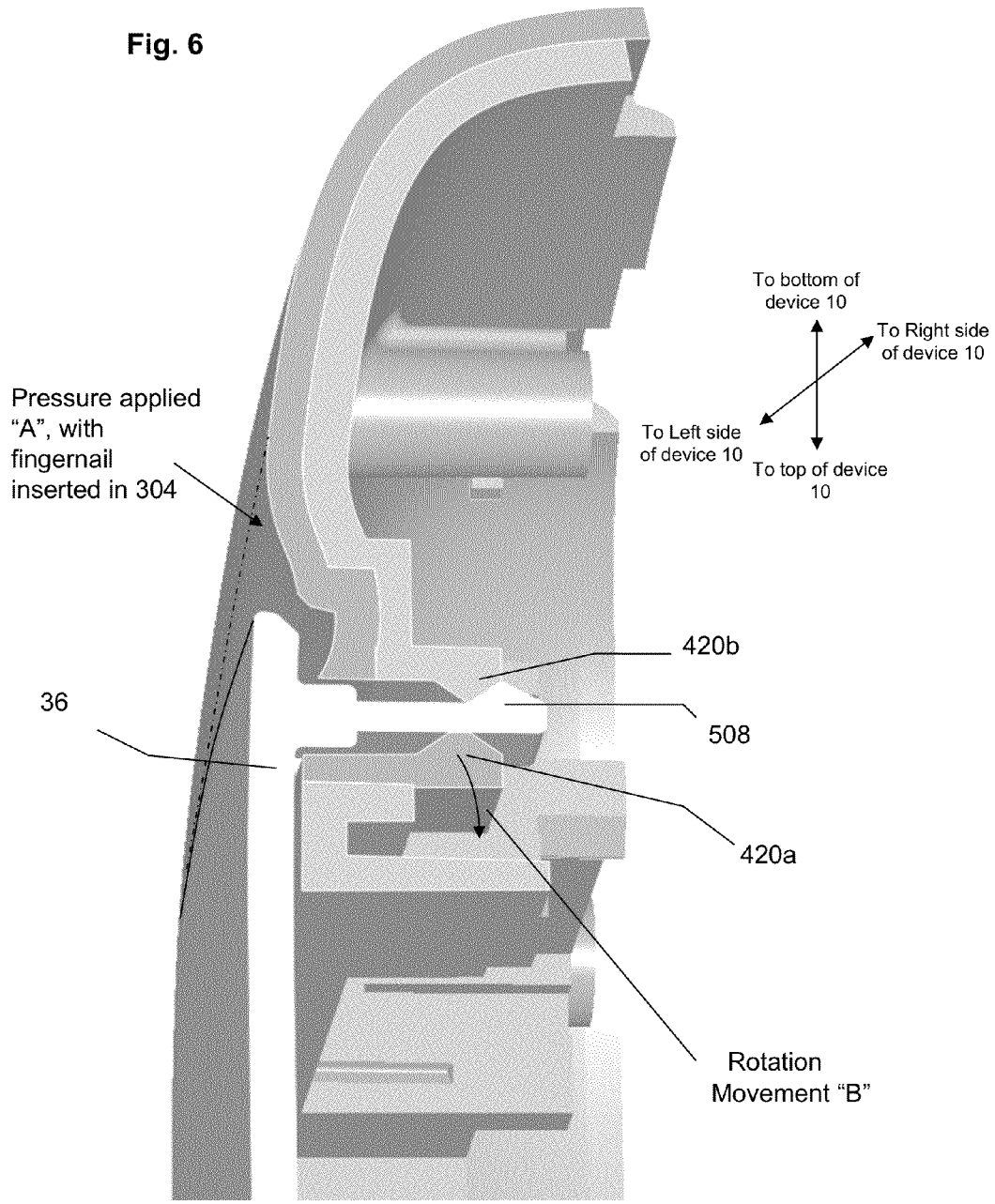

LOCKING MECHANISM FOR A COVER FOR A HOUSING OF AN ELECTRONIC DEVICE

RELATED APPLICATION

This application claims the benefit of U.S. provisional application Ser. No. 61/223,593 filed on Jul. 7, 2009.

FIELD OF DISCLOSURE

The disclosure described herein relates generally to a locking mechanism for a cover for a housing of an electronic device, such as a handheld electronic communication device. In particular, the disclosure relates to a feature on the cover that interacts with a feature on the housing to keep the cover secured to the housing, until a specific action is initiated to allow the cover to be removed from the housing.

BACKGROUND

A conventional handheld electronic device, such as a Personal Digital Assistant (PDA) and a wireless telephone, includes a keyboard/keypad, a display and a system printed circuit board (PCB) disposed within a common housing. A battery is commonly provided to power the electronics of the device. The battery is typically contained within the housing. If the battery is replaceable, the housing typically has a receptacle in its back to receive the battery. A cover is provided to enclose the battery within the housing. Another receptacle, opening, well or other compartment may be provided to enclose other components, such as memory cards and the like.

Conventional covers and housings provide locking mechanisms that selectively lock the cover in position to the housing. Such conventional covers use multiple parts, including metal clasps and the like, to provide a positive lock for the cover to the housing. Accordingly, conventional covers are susceptible to disengagement from the housing if a sufficient force or flex is applied to the cover, e.g. from inadvertently hitting the cover.

BRIEF DESCRIPTION OF THE DRAWINGS

The disclosure will now be described, by way of example only, with reference to the accompanying drawings, in which:

FIG. 3A is a rear plan view of a back housing and a cover in place in the back housing of the device of FIG. 1;

FIG. 4A is a rear plan view of the back housing alone of the device of FIG. 3A;

FIG. 6 is a side perspective cross section view of a portion of the back housing with the cover of the device of FIG. 3A;

DETAILED DESCRIPTION OF THE DISCLOSURE

Figure 1:
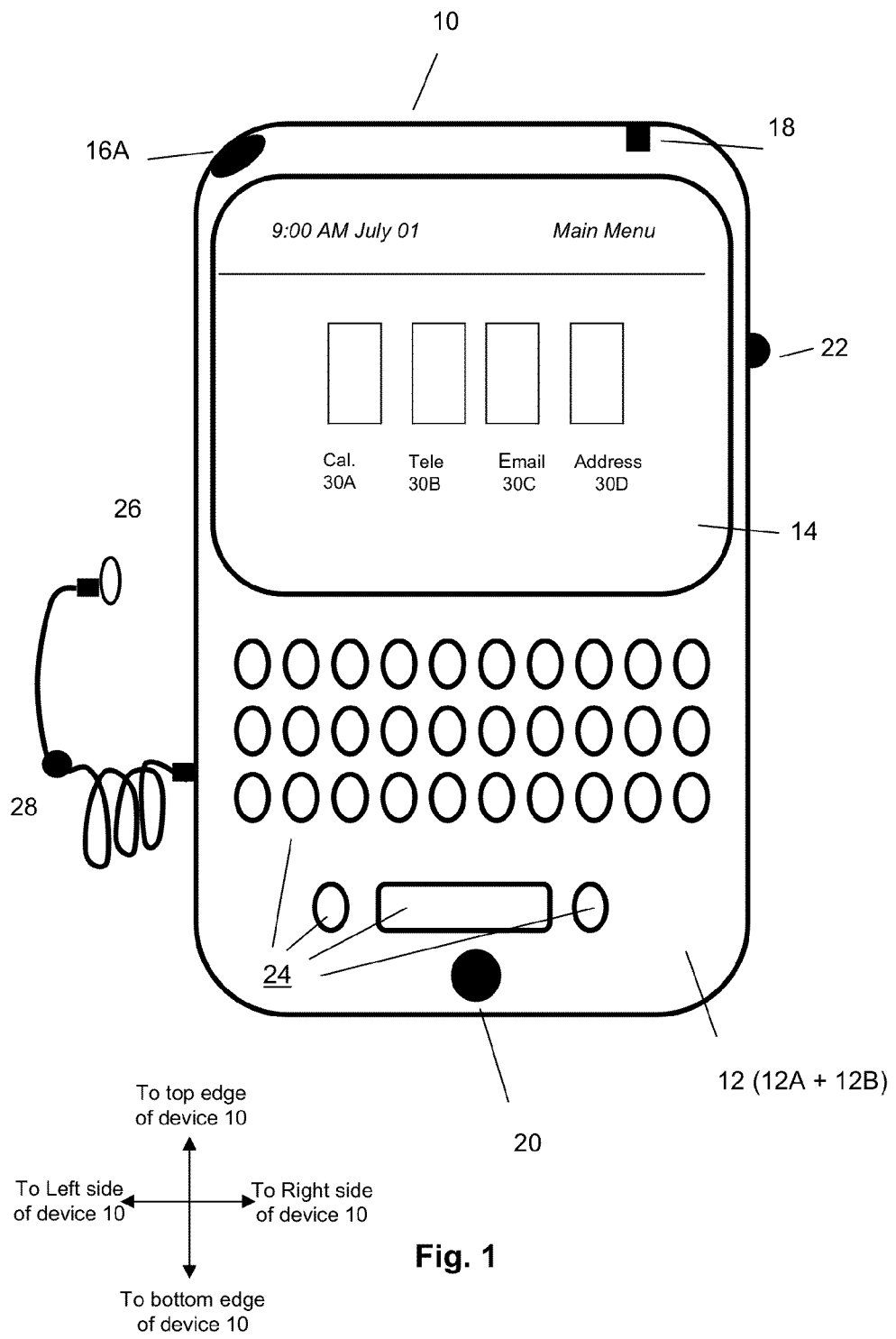
FIG. 1 is a front plan view of an electronic device with its housing in accordance with an embodiment.

The description which follows and the embodiments described herein are provided by way of illustration of an example or examples of particular embodiments of the principles of the present disclosure. These examples are provided for the purposes of explanation and not limitation of those principles and of the disclosure. In the description which follows, like parts are marked throughout the specification and the drawings with the same respective reference numerals.

In a first aspect, a housing for an electronic device is provided. The housing comprises: a back housing defining an interior compartment or portion of the device; a receptacle to receive a first locking feature from a cover for the electronic device; and at least one moveable second locking feature in the receptacle to engage the first locking feature to hold the cover to the housing. In the housing, the at least one moveable second locking feature is selectively moved from a first engaged position with the first locking feature to a second disengaged position with the first locking feature when a predefined force is applied at a specific location at the housing or the cover.

The back housing may further comprise a layer of elastomeric material on its outer surface, wherein the elastomeric material forms part of the receptacle.

In the housing, the first locking feature may be a locking pin having a projection therein.

In the housing, the receptacle may comprise: a first or upper wall formed from the elastomeric material; and a first or upper wall protrusion. In the receptacle, the first wall protrusion may be formed from the elastomeric material and may be part of the second locking feature.

The back housing may further comprise a layer of plastic underneath the layer of elastomeric material, wherein the plastic forms another part of the receptacle.

The receptacle may further comprise: a second or lower wall formed from the plastic; and a second or lower wall protrusion. In the receptacle, the lower wall protrusion may be formed from the plastic and may be part of the second locking feature.

The back housing may further define an indentation, such that when an external downward pressure is applied to the indentation, the first wall is deflected to move the first wall protrusion of the first wall away from the second wall. The back housing may be formed from a two-shot injection process using the elastomeric material and the plastic.

In the housing, the back housing may further comprise a layer of plastic underneath the layer of elastomeric material, wherein the plastic forms another part of said receptacle.

In the housing, the receptacle may further comprise a second wall formed from the said plastic and including a second wall protrusion, where the second wall protrusion may be formed from the plastic.

In the housing, the back housing may be formed from a two-shot injection process using the elastomeric material and plastic.

In the housing, the layer of plastic may be formed in a first shot of a two shot moulding process, where the layer of elastomeric material is formed in a second shot for the process.

In the housing, the back housing may form a collar extending inwardly to the interior of device around said receptacle.

In the housing, the collar may be formed as part of the layer of plastic.

In the housing, the collar may be located above the second locking feature.

In the housing, the second wall protrusion may protrude towards the collar.

In the housing, the second locking feature may be the first wall protrusion, where the first and second locking features may interact in a first arrangement when the locking pin is inserted into the receptacle with the locking pin engaged below the first wall protrusion to prevent removal of the locking pin from the receptacle and the first locking feature may be released from the second locking feature when the predefined force is applied at the specific location of the back housing to deflect the housing to release engagement of the first locking pin from the first wall protrusion.

In the housing, when the cover rests against the elastomeric material of the first wall, the first wall may provide absorption of external shocks applied to the cover.

In the housing, a gap may be formed between the cover and the back housing about the specific location.

In the housing, the gap may be sized to allow insertion of a fingernail of a finger therein while the predefined force is applied.

In the housing, the predefined force may be applied with the fingernail inserted in the gap to allow removal of the cover from the back housing with one hand.

In the housing, the locking pin may be located at a distal end of the cover.

In other aspects various combinations of sets and subsets of the above aspects are provided.

Figure 2:
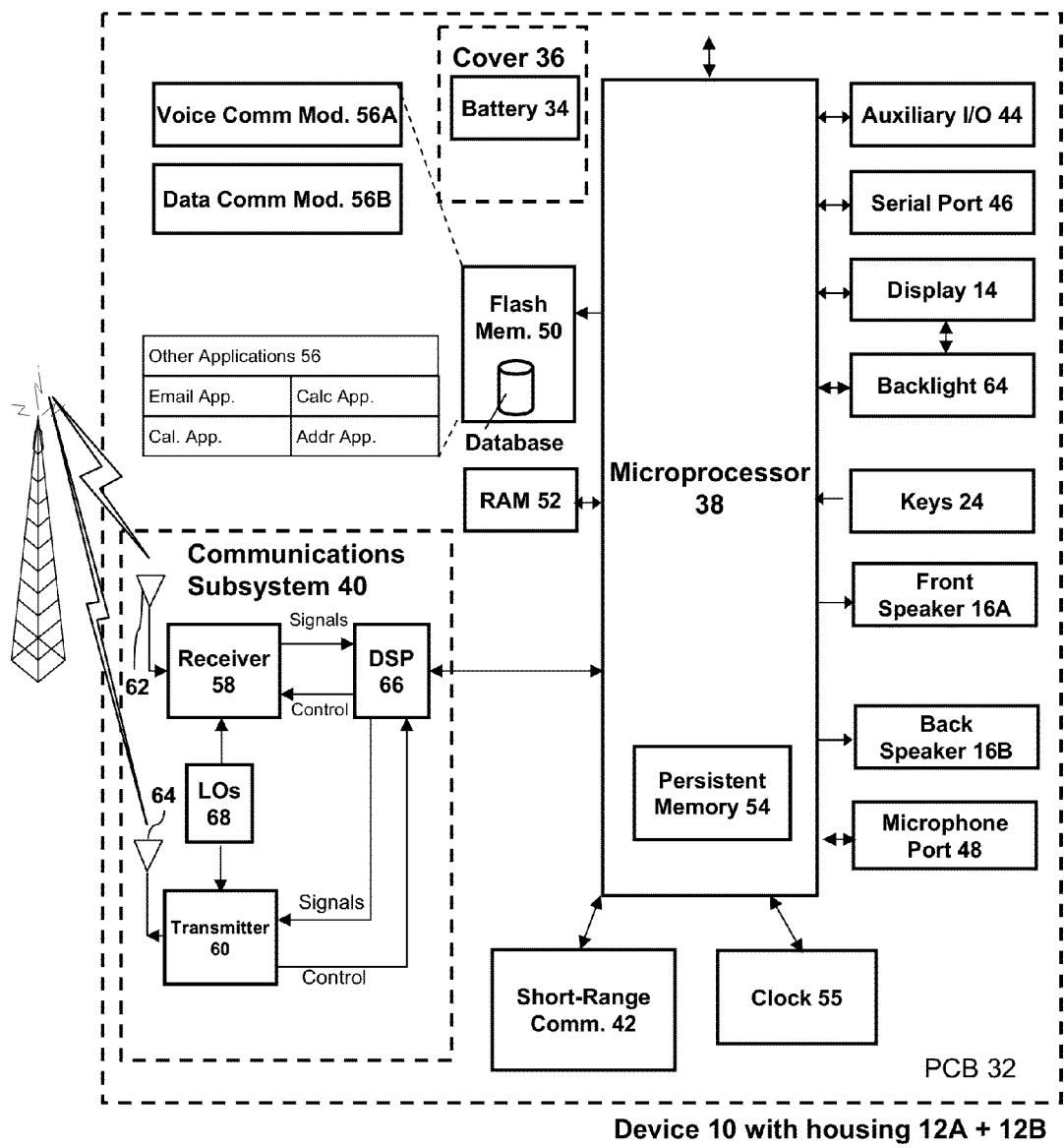
FIG. 2 is a block diagram of internal components of the device of FIG. 1 including the front speaker and the enclosure system.

Now some general functional elements of a device incorporating an embodiment are provided. Referring to FIGS. 1 and 2, an electronic device for receiving electronic communications in accordance with an embodiment of the disclosure is indicated generally at 10. In the present embodiment, electronic device 10 is based on a computing platform having exemplary functionality of an enhanced personal digital assistant such as cellphone, e-mail, photographic and media playing features. It is, however, to be understood that electronic device 10 can be based on construction design and functionality of other electronic devices, such as smart telephones, desktop computers, pagers or laptops having telephony equipment. Further it would be appreciated that other embodiments may provide the locking mechanism when a cover is provided for a housing for any device. In a present embodiment, electronic device 10 includes a housing 12 comprising a front housing 12A and a rear or back housing 12B (not shown). There may be one or more components in device 10, including, for example any of: a display 14, front speaker 16A, a light emitting diode (LED) indicator 18, a trackball 20, a trackwheel (not shown), an ESC ("escape") key 22, keys 24, a touchpad (not shown), a telephone headset comprised of an ear bud 26 and a microphone 28. Display 14 may be a liquid crystal display (LCD) and may incorporate a touchscreen. Trackball 20 and ESC key 22 can be inwardly depressed as a means to provide additional input signals to device 10, and are not limited to the locations shown in FIG. 1. Other components may also be provided in device 10. Apertures may be provided in housing 12 to allow access to components located inside device 10.

Housing 12 provides a frame and an exterior shell to house and protect its components. The frame may be formed to have one or more physical features to define specific locations for its components. The features of housing 12 may be formed via an injection moulding process that includes one or multiple shots of material. It may have coatings, such as metallicized paints or coatings provided to interior or exterior surfaces or regions. Housing 12 can be made from any suitable material, such as metal, plastic, any polycarbonate material (such as EXL 1414—trademark—from General Electric), any elastomeric material, any polyurethane material (such as TPSIV 2245-65A from Dow Corning Company) and any combination of these materials, as will occur to those of skill in the art and may be suitably formed to house and hold all components of device 10.

Device 10 is operable to conduct wireless telephone calls, using any known wireless phone system such as a Global System for Mobile Communications ("GSM") system, Code Division Multiple Access ("CDMA") system, Cellular Digital Packet Data ("CDPD") system and Time Division Multiple Access ("TDMA") system. Other wireless phone systems can include Bluetooth and the many forms of 802.11 wireless broadband, like 802.11a, 802.11b, 802.11g, etc. that support voice. Other embodiments include Voice over IP (VoIP) type streaming data communications that can simulate circuit switched phone calls.

Various applications are provided on device 10, including email, telephone, calendar and address book applications. A graphical user interface (GUI) providing an interface to allow entries of commands to activate these applications is provided on display 14 through a series of icons 30. Shown are calendar icon 30A, telephone icon 30B, email icon 30C and address book icon 30D. Such applications can be selected and activated using the touchpad and/or the trackball 20. It will be appreciated that installed applications operating on device 10 control the operation of each of these applications.

Keys 24 provide one or more distinct, fixed input keys for device 10. Typically, they may include at least part of keys in an alphanumeric character set. A touchpad may be provided and configured to provide an additional set of "keys" (or input areas) to augment keys 24. Keys may also be incorporated into part of a touchscreen on device 10.

Referring to FIG. 2, functional elements, modules, components and systems of device 10 are provided. The functional elements are generally electronic or electro-mechanical devices mounted within housing 12. Many devices are also mounted on an internal substrate, such as a printed circuit board (PCB) 32. A substrate is any generally planar rigid platform. In one embodiment, PCB 32 is a substrate for mounting and supporting the internal components on both of its top and bottom sides and provides some electrical circuitry for the devices, as defined by etchings within the layers of plastic and copper. As such, components can be more densely packed thereon, thereby reducing the size of PCB 32. PCB 32 is securely mountable within housing 12 (comprising front housing 12A mating to back housing 12B), typically via screws. PCB 32 is a generally planar sandwich of layers of plastic (or FR4) and copper. PCB 32 allows components to be placed on both of its sides ("top" and "bottom"). Some components may require isolation or sufficient physical separation from other components. For example, radio frequency (RF) signals from antenna may interfere with the operation of other devices. Shielding may be provided. Further details on these components and layouts are provided below.

A power switch (not shown) provides an "on/off" switch for device 10. Upon activation of the power switch an application is initiated to turn on device 10. Upon deactivation of the power switch, an application is initiated to turn off device 10. Power to device 10 may also be controlled by other devices and by internal software applications. Additional supplementary power may be provided by additional circuits (which may be referred to as modules) and components in device 10. Powering electronics of the mobile handheld communication device is power source 34 (shown in FIG. 2 as "battery"). The power source 34 may be one or more batteries. The power source 34 may be a single battery pack, such as a rechargeable battery pack. Alternative power source(s) may be provided. The battery 34 may be removable from device 10 and may be stored in a compartment in housing 12 (typically a well 406, which defines an opening in the back housing 12B). A cover 36 may be provided to cover the well 406. Cover 36 may be locked in place over the well through a locking mechanism with housing 12B. Further detail on cover 36, housing 12B, the locking mechanism and the interaction of these elements is provided later.

Microprocessor 38 is provided to control and receive almost all data, transmissions, inputs and outputs related to device 10. Microprocessor 38 is shown schematically as coupled to keys 24, touchpad (not shown), display 14 and other internal devices. Microprocessor 38 controls the operation of display 14, as well as the overall operation of device 10, in response to actuation of keys 24 and keys on the touchpad (not shown). Exemplary microprocessors for microprocessor 38 include microprocessors in the Data 950 (trade-mark) series, the 6200 series and the PX900 series, all available at one time from Intel Corporation.

In addition to microprocessor 38, other internal devices of device 10 include: a communication subsystem 40; a short-range communication subsystem 42; touchpad (not shown); and display 14; other input/output devices including a set of auxiliary I/O devices through port 44, a serial port 46, a front speaker 16A, a back speaker 16B, and a microphone port 48 for microphone 28; and memory devices including a flash memory 50 (which provides persistent storage of data) and random access memory (RAM) 52; persistent memory 54; clock 55 and other device subsystems (not shown).

Speakers are provided to generate audible output signals for device 10, for example, received voice signals for telephone calls, music from digital signals, enunciator signals generated by applications operating on device 10. Front speaker 16A is provided as a main audible signal generator. Back speaker 16B is an auxiliary speaker and may be used to generate louder audio signals, for example for a speaker phone operation; back speaker 16B may be provided on the back housing 12B, but may also be provide on other locations in device 10, such as on its side or even on its front housing 12A. One or both of speakers 16A and 16B may be selected and tuned to operate in an acoustic frequency range suitable for telephone voice transmissions, where a focus is typically placed on response characteristics of signals between about 300 Hz and about 3,300 Hz. Components in device 10 provide and generate electrical signals for speakers 16, which when received by speakers 16 are converted to acoustic signals per typical operation of a speaker.

Persistent memory 54 may be a separate memory system to flash memory 50 and may be incorporated into a component in device 10, such as in microprocessor 38. Additionally or alternatively, memory 54 may be removable from device 10 (e.g. such as a SD memory card) and may be accessed through back housing 12B after removal of cover 36, whereas flash memory 50 may be permanently connected to device 10.

Device 10 may be a two-way radio frequency (RF) communication device having voice and data communication capabilities. In addition, device 10 may have the capability to communicate with other computer systems via the Internet.

Operating system software executed by microprocessor 38 is preferably stored in a computer readable medium, such as flash memory 50, but may be stored in other types of memory devices (not shown), such as read only memory (ROM) or similar storage element. In addition, system software, specific device applications, or parts thereof, may be temporarily loaded into a volatile storage medium, such as RAM 52. Communication signals received by the mobile device may also be stored to RAM 52.

Microprocessor 38, in addition to its operating system functions, enables execution of software applications on device 10. A set of software applications 56 that control basic device operations, such as voice communication module 56A and data communication module 56B, may be installed on device 10 during manufacture or downloaded thereafter. Exemplary applications include an email processing application, a calculator, an address management application and others.

Communication functions, including data and voice communications, are performed through communication subsystem 40 and short-range communication subsystem 42. Collectively, subsystem 40 and subsystem 42 provide a signal-level interface for all communication technologies processed by device 10. Various other applications 56 provide the operational controls to further process and log the communications. Communication subsystem 40 includes receiver 58, transmitter 60 and one or more antennas, illustrated as receive antenna 62 and transmit antenna 64. In addition, communication subsystem 40 also includes processing module, such as digital signal processor (DSP) 66 and local oscillators (LOs) 68. The specific design and implementation of communication subsystem 40 is dependent upon the communication network in which device 10 is intended to operate. For example, communication subsystem 40 of device 10 may be designed to work with one or more of a Mobitex (trade-mark) Radio Network ("Mobitex") and the DataTAC (trade-mark) Radio Network ("DataTAC"). Voice-centric technologies for cellular device 10 include Personal Communication Systems (PCS) networks like Global System for Mobile Communications (GSM) and Time Division Multiple Access (TDMA) systems. Certain networks provide multiple systems. For example, dual-mode wireless networks include Code Division Multiple Access (CDMA) networks, General Packet Radio Service (GPRS) networks, and so-called third-generation (3G) networks, such as Enhanced Data rates for Global Evolution (EDGE) and Universal Mobile Telecommunications Systems (UMTS). Other network communication technologies that may be employed include, for example, Ultra Mobile Broadband (UMB), Evolution-Data Optimized (EV-DO), and High Speed Packet Access (HSPA), etc.

Display 14 has backlight system 64 to assist in the viewing of display 14, especially under low-light conditions. A backlight system is typically present in a LCD. A typical backlight system comprises a lighting source, such as a series of LEDs or a lamp located behind the LCD panel of the display and a controller to control activation of the lighting source. The lamp may be fluorescent, incandescent, electroluminescent or any other suitable light source known to a person of skill in the art.

With some features of device 10 described above, further detail is provided on notable features of an embodiment, relating to a cover and a locking mechanism that mate with a housing for an electronic device.

A general aspect of an embodiment provides a locking mechanism for a cover of a housing of a device, such as an electronic device. In one embodiment, the locking mechanism is provided through a first (locking) feature provided on the cover that interacts with a second (locking) feature provided on the housing. In one embodiment, the locking mechanism is selectively disengaged by a specific application of a force at a location on the housing which causes the second feature to decouple from the first feature. In another embodiment, the housing provides a cushioning effect for the cover to keep the locking mechanism engaged when an external force is applied to the cover, which is not intended to disengage the locking mechanism. One feature of an embodiment provides a locking mechanism where two components on the housing and the cover interact with each other. One component is made from a material having a (more) rigid composition and the second component is made from a compliant material. The compliant material acts in its form as a spring to assist with the locking mechanism. Components of the housing, the cover and the locking mechanism can be formed through an injection moulding process or other processes. Further details of each of aspects of embodiments are provided below.

Position/direction terms (e.g. front, back, left, right, etc.) are used herein to identify relative positions and directions for certain elements of device 10 (e.g. "There is a left side and a right side of the device"). Generally, when device 10 is held in its expected orientation by a user, display 14 faces the user. For example, device 10 in FIG. 1 may be held by a user in his hand such that display 14 is oriented in the user's hand to be above keys 24. When device 10 is viewed in such an orientation, the "front" side of device 10 is the side facing the user; the "back" side of device 10 is the side contacting the palm of the user's hand; the "top" side of device 10 is the upper end of device 10 (where speaker 16A is located) that extends away from the user when device 10 is being held; and the "bottom" side of device 10 is the lower end of device 10 (where keys 24 are located) that extends away from the user when device 10 is being held. For the purposes of illustration, references to front side, back side, left side, right side, and top and bottom ends are provided using the orientation markings relative to the side view of device 10 as shown in the Figs.

It will be appreciated that the terms "top" and "upper" may be used interchangeably with the "front" side and the "top" end of device 10, and similarly that the terms "bottom", "rear" and "lower" may be used interchangeably with the "back" side of device 10. Similarly, dimension terms like "width", "length", "height" and "depth" can be applied to different features of an element depending on a current perspective. The relative positions and directions will be clear in the context of the use of the terms. These references provide relative positional references for components for convenience only and are not meant to be limiting, unless otherwise noted.

Figure 3B:
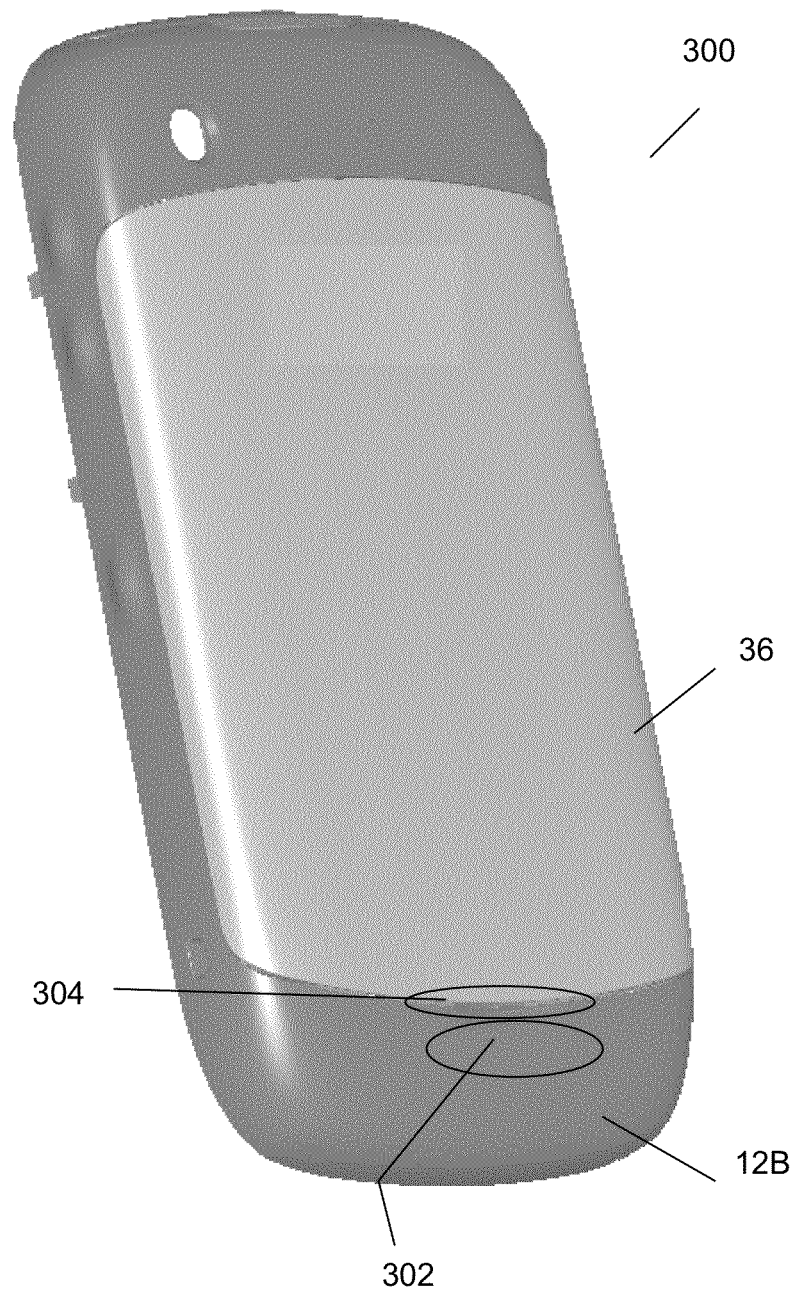
FIG. 3B is a rear perspective view of the back housing and the cover in place in the back housing of the device of FIG. 3A.

Referring to FIGS. 3A and 3B, views 300 show the back side of device 10 wherein the back housing 12B includes the cover 36 being mounted thereto. Generally, cover 36 and back housing 12B are both physically designed to complement each other, so that when cover 36 is mated to back housing 12B (and held in place with assistance of a locking mechanism), the exposed exterior edges of cover 36 align with corresponding features in back housing 12B. Notably, there is a gap 304 provided in this alignment of cover 36 to back housing 12B. As shown in FIG. 3A, gap 304 is formed in part by a depressed area on back housing 12B and/or a raised area on cover 36. As shown in FIG. 3A, back housing 12B is also formed to define a slight inward indentation 302, so that the lower edge of cover 36 does not mate flush with back housing 12B. As shown in FIG. 3A, indentation 302 is located adjacent to gap 304 toward the bottom of device 10. The gap 304 is provided to allow a user to place his fingernail underneath and pry cover 36 from back housing 12B by using the finger as a lever with its fulcrum placed against back housing 12B around indentation 302 and the fingernail underneath cover 36 through gap 304. A prying motion of the finger, where the user's fingernail is levered upwardly will release the locking mechanism, allowing cover 36 to be removed from back housing 12B. Further detail on physical characteristics of cover 36, back housing 12B and the locking mechanism are provided below.

Referring to FIG. 4A, view 400 shows back housing 12B alone without cover 36. Back housing 12B has frame 401 which provides physical structures and features to housing components of device 10 and to provide at least part of the exterior shape of device 10. Frame 401, as shown, includes a combination of shaped panels, cantilevers, bars, etc. and other physical structures. Back housing 12B has an exterior surface 402, which is not covered by cover 36, interior portion or compartment 404, well 406 defined in the interior portion 404, and openings 408 provided at a top end of interior portion 404. Interior portion 404 is defined in part by frame 401 as a series of formations to accommodate various components of device 10. Interior portion 404 and openings 408 are enclosed by cover 36 when it is in place. Openings 408 are provided to mate with corresponding tabs or flanges 502 in cover 36. A receptacle 410 is defined at a bottom end of interior portion 404 and adjacent to the indentation 302 (FIGS. 3A-3B). Receptacle 410 is one part of a locking mechanism of an embodiment. Receptacle 410 is formed to receive a locking feature or pin 504 from cover 36. The locking feature provides the complementary locking feature for the locking mechanism. In one embodiment, receptacle 410 is a rectangular cavity having four side walls with an open top. A bottom may be provided for receptacle 410. Other shapes may be provided for receptacle 410. Battery 34 may be inserted into a corresponding recess (not shown) located within well 406 and defined in interior portion 404.

Figure 4B:
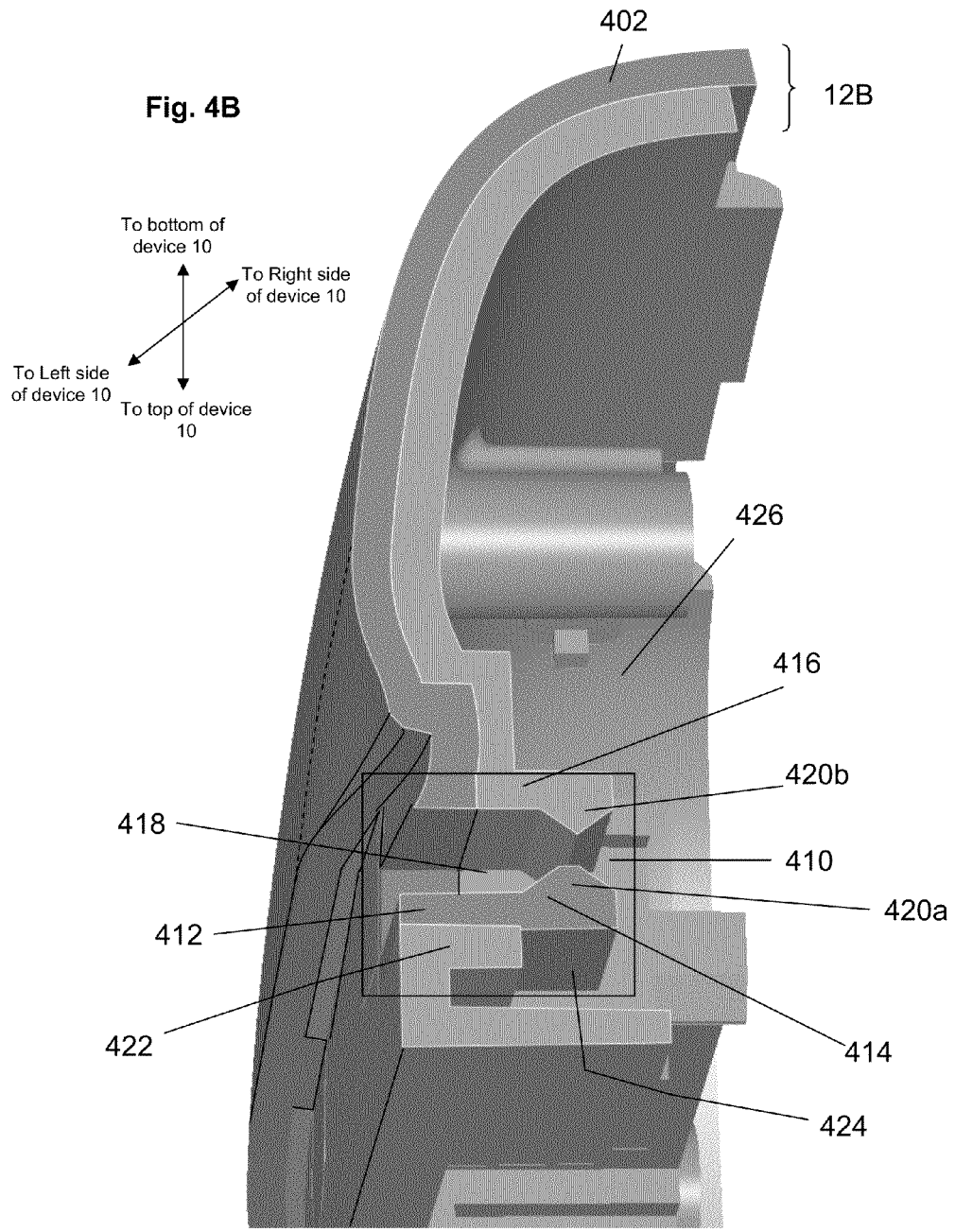
FIG. 4B is a side perspective cross section view of a portion of the back housing of the device of FIG. 3A.

Referring to FIG. 4B, further details of back housing 12B are provided. In one embodiment, back housing 12B is formed through an injection moulding process. One embodiment utilizes a "two-shot" moulding process to form back housing 12B with two separate materials. The first shot material forms features of part of interior portion 404. In one embodiment, the first shot material is a polycarbonate material (such as EXL 1414—trademark—from General Electric). This first shot provides a form that has a rigid composition. The second shot material for exterior surface 402 is an elastomeric material, such as any polyurethane material (such as TPSIV 2245-65A from Dow Corning Company). This material provides a rubber-like texture which provides an enhanced "feel" and texture for the user. The elastomeric material provides a form that is compliant. The compliant form acts as a spring to assist with the locking mechanism. It will be appreciated that in other embodiments a one shot mould may be provided or three or more shots may be provided. The order of the shots may be changed to suit moulding parameters. In other embodiments, the materials for each of the first and second shots may be interchanged or other materials may be used.

The second shot of elastomer also forms part of receptacle 410, namely left wall 412, a right wall (not shown), and an upper or first wall 414. Left wall 412, right wall and upper wall 414 extend laterally inwardly towards the interior of device 10 from the surface of interior portion 404. The first shot of polycarbonate forms a lower or second wall 416 of receptacle 410. Space 418 is defined within the four walls of receptacle 410 to receive a locking pin 504 (FIG. 5A) from cover 36. Each of walls 414 and 416 has protrusions 420 (hereinafter defined as first or upper wall protrusion 420a and second or lower wall protrusion 420b) which extend laterally into space 418 from their sides. In one embodiment each protrusion is a wedge shaped feature (with its base attached to the bottom side of its wall) and with its tip extending into space 418 of receptacle 410.

The first shot of polycarbonate also forms collar 422 around space 418. On the upper side of receptacle 410, collar 422 extends inwardly to the interior of device 10 from the surface of interior portion 404 and provides some support around receptacle 410. However, it does not extend fully inwardly to the full interior extension of upper wall 414, where pocket 424 is provided. When fully assembled, antenna 62/64 may be located in cavity 426 defined immediately below wall 416.

Figure 5A:
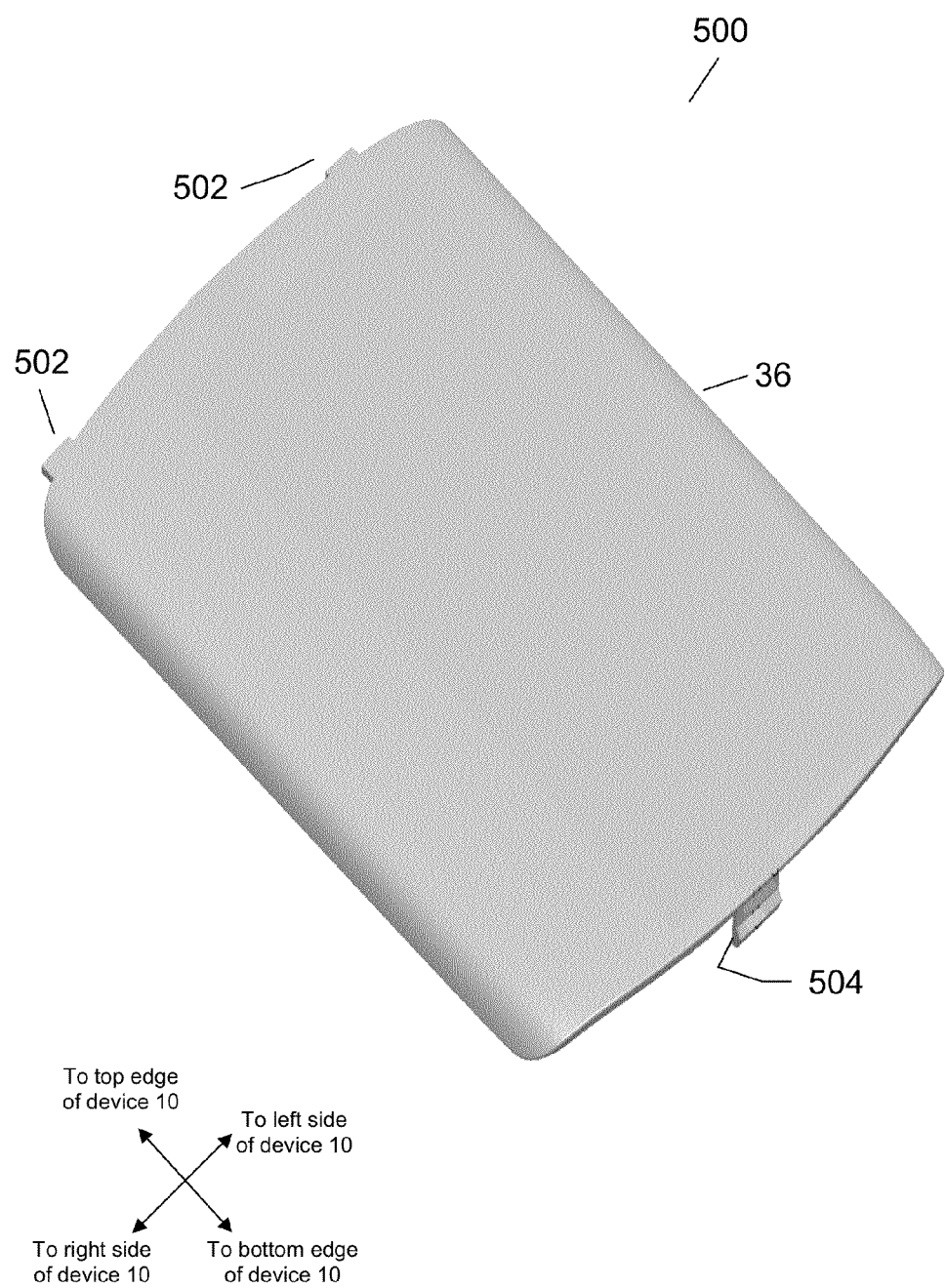
FIG. 5A is a rear perspective view of the cover alone of the device of FIG. 3A.
Figure 5B:
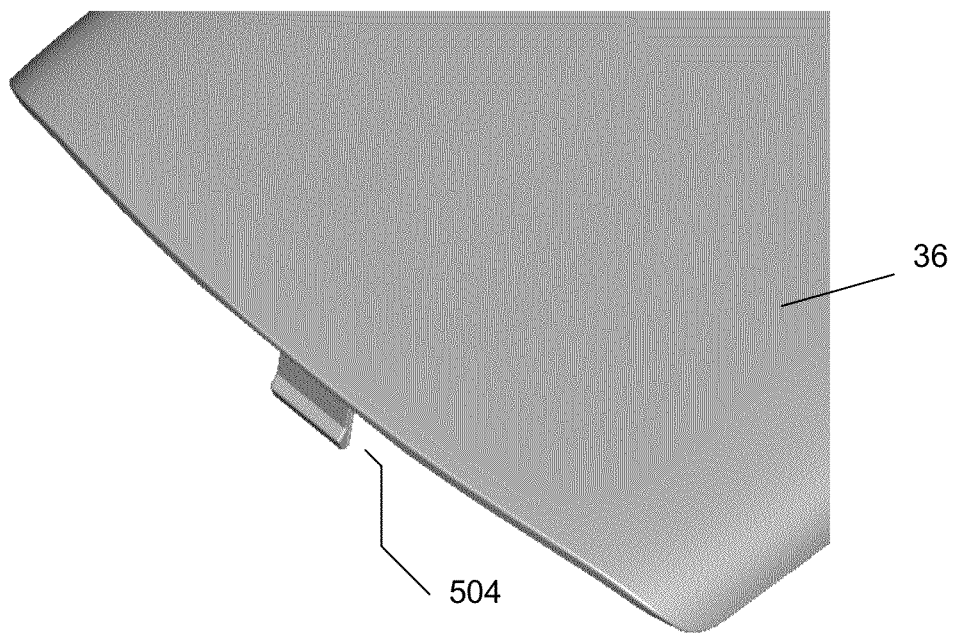
FIG. 5B is a rear perspective view of a part of the cover of the device of FIG. 5A.
Figure 5C:
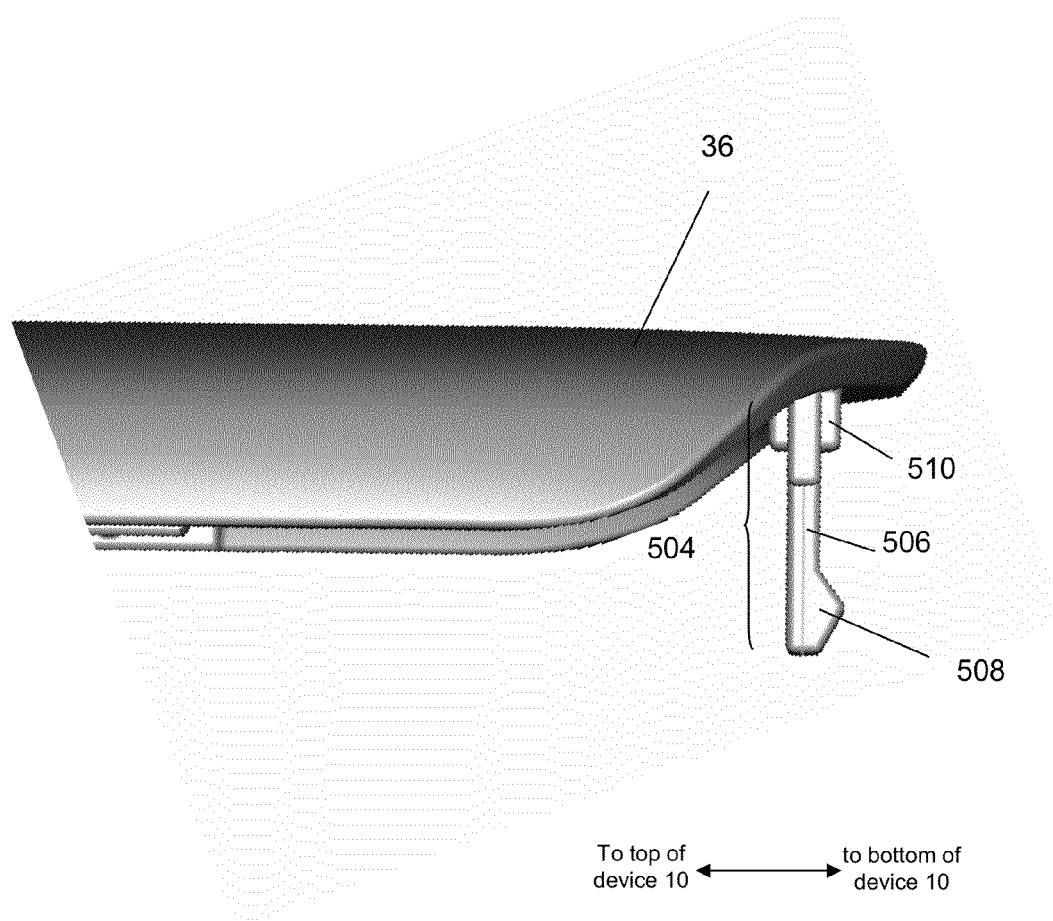
FIG. 5C is a rear side view of a part of the cover of the device of FIG. 5A.

Referring to FIGS. 5A, 5B and 5C, further features of cover 36 are shown. In FIG. 5, view 500 shows cover 36, which is shaped to mate with back housing 12B (FIG. 4) and to enclose interior portion 404. Flanges 502 located on the top edge of cover 36 project inwardly to the interior of device 10 and upwardly to the top of device 10 and are located just below the exterior surface of cover 36. The location and size of flanges 502 are made so that they mate with openings 408 in back housing 12B (FIG. 4). At the bottom edge of cover 36, locking pin 504 is provided. Locking pin 504 projects inwardly towards the interior of device 10 from the bottom of cover 36 and is shaped and located to mate with receptacle 410 of housing 12B (FIG. 4). Generally, when cover 36 is mated to back housing 12B, the interior surface of cover 36 is flush against one or more of the top surface of battery 34 (when installed in well 406) and one or more upper surfaces of interior portion 404.

Referring to FIGS. 5B and 5C, further features of locking pin 504 are provided. Locking pin 504 projects inwardly (i.e. towards the interior of device 10) from the interior surface of cover 36 near its bottom (namely at one of its distal ends). Locking pin 504 comprises shaft 506, which is generally a rectangular form, with a long axis running along the transverse axis of cover 36. Supports 510 may be provided at the base of shaft 506 (i.e., adjacent to the interior surface of cover 36) to provide additional support as pin 504 is flexed. At the end of shaft 506, projection 508 is provided, which in one embodiment is a wedge shaped feature (with its base attached to the end side of shaft 506) and with its tip extending outwardly and towards the bottom of device 10 (FIG. 6). In one embodiment, projection 508 is provided as a single feature on shaft 506. Dimensions and features for various any of locking pin 504, projection 508 and receptacle 410 are provided so that the locking pin may be inserted into receptacle 410 and minimal or minor physical force is required to push projection 508 past its complementary upper wall and lower wall protrusions (or locking features) 420a and 420b, respectively, in receptacle 410. It can be appreciated that locking pin 504 is shaped to mate with receptacle 410 (FIG. 4A) and that projection 508 on locking pin 504 is shaped to interact with one or more of protrusions 420a and b on upper and lower walls 414 and 416, respectively, of receptacle 410. Once the locking mechanisms are engaged, cover 36 is positively held against back housing 12B until a directed force is applied to a predefined area on either back housing 12B or cover 36 to release the locking mechanism. In other embodiments, one or more projections may be provided on one or more locations on shaft 506. Further in other embodiments, one or more locking pins 504 may be provided at one or more locations on cover 36.

Referring to FIGS. 6, 7A, 7B, 8A and 8B, details on interactions of cover 36 when mated to back housing 12B are shown.

In FIG. 6, cover 36 and its locking pin 504 is shown as fully inserted into receptacle 410. Generally, to attach cover 36 to back housing 12B, the upper end of cover 36 is first engaged with back housing 12B so that flanges 502 are mated with corresponding openings 408 in back housing 12B (not shown). Next, the lower part of cover 36 is tilted towards the bottom of back cover 12B and locking pin 504 is engaged with receptacle 410. Cover 36 is pressed against back housing 12B such that projection 508 is inserted past the upper and lower wall protrusions 420a and b of receptacle 410. As projection 508 moves inwardly past the upper and lower wall protrusions 420a and 420b, one or both of upper and lower walls 414, 416 and pin 504 may be deflected to allow the locking mechanism to engage by allowing projection 508 to be placed past the upper and lower wall protrusions 420a and 420b. When pin 504 is fully inserted into receptacle 410, upper and lower wall protrusions 420a and 420b and projection 508 provide a tight friction fit to resist outward movement of pin 504 from receptacle 410. Cover 36 may be formed from an injection mould process using a polycarbonate material (such as EXL 1414—trademark—from General Electric). Cover 36 may also be formed with additional material.

Figure 7A:
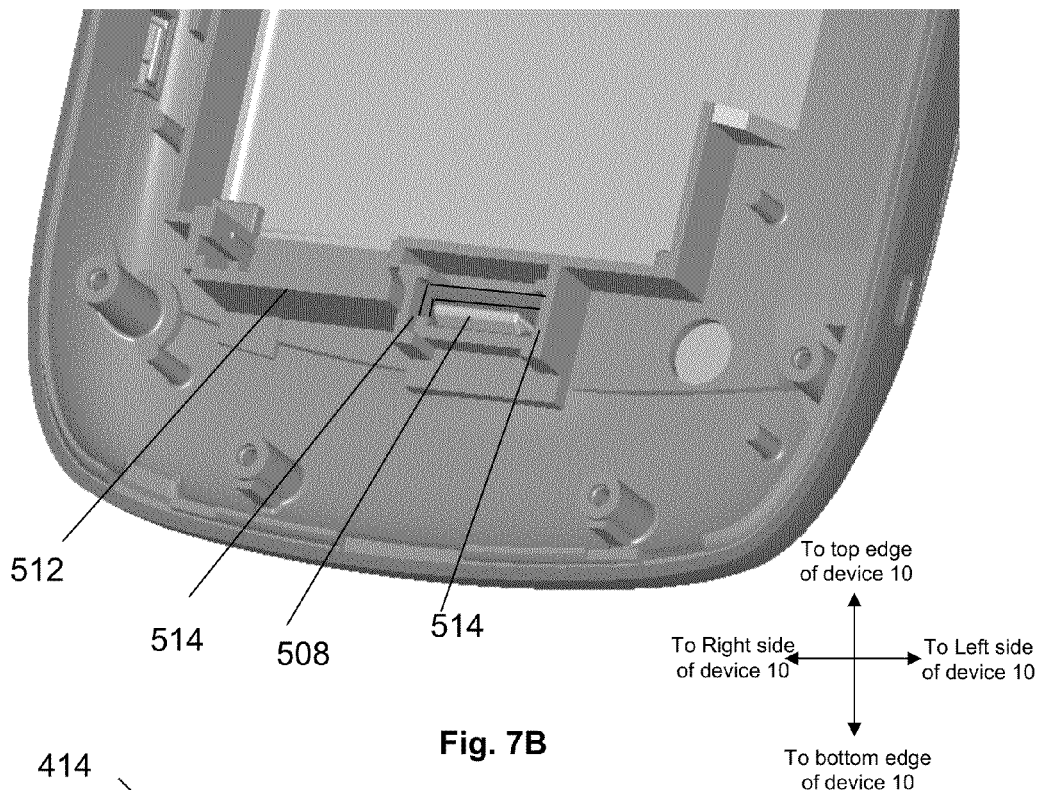
FIG. 7A is a perspective section view of a portion of the interior of the back housing with the cover of the device of FIG. 3A.
Figure 7B:
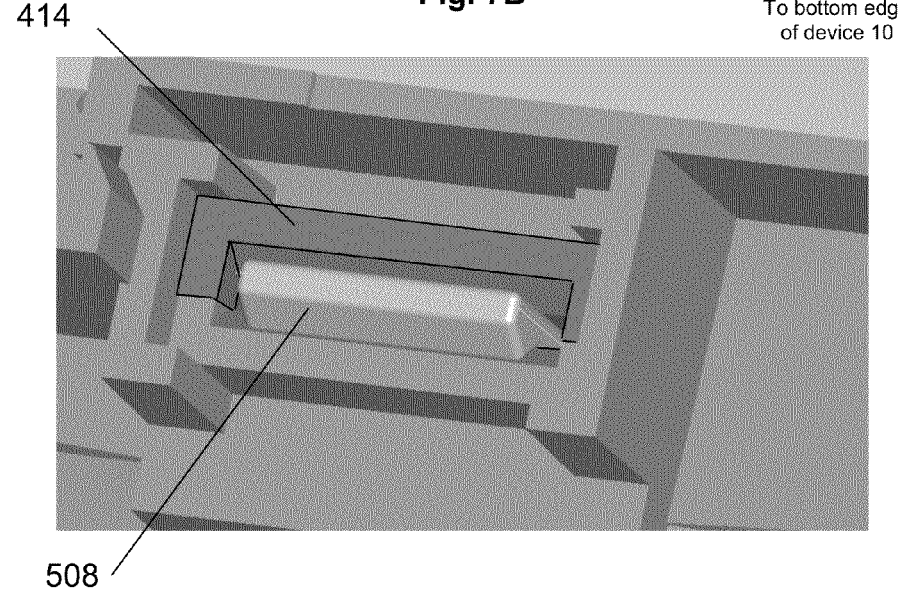
FIG. 7B is a perspective view of a portion of the interior of the back housing with the cover of the device of FIG. 3A.

In FIGS. 7A and 7B, back housing 12B has a frame 512 projecting inwardly from its interior surface to define a part of a boundary for well 406. Also, side walls 514 project inwardly from interior surface of housing 12B to define lateral collars 422 (FIG. 4B) for receptacle 410. Frame 512 and side walls 514 may be formed from polycarbonate material, although other materials with similar properties may be appropriate.

In one embodiment, upper wall protrusion 420a on upper wall 414 is located slightly higher than lower wall protrusion 420b on lower wall 416. The lower edge of lower wall protrusion 420b is flush against the upper edge of projection 508, when the cover 36 is properly assembled to back housing 12B. This tight friction fit provides a snug retention arrangement to keep cover 36 connected to back housing 12B.

When cover 36 is mated to back housing 12B, the interior face of cover 36 rests against the elastomeric material on the upper surface of upper wall 414. Since upper wall 414 is compliant, flexible and pliable, it provides a "shock absorber" to exterior inward forces applied to cover 36. When an exterior inward force is applied to cover 36, this force is translated through cover 36 to the top surface of upper wall 414 and the upper wall is compressed to absorb some of the force. Meanwhile the friction interface between projection 508 on pin 504 and lower wall protrusion 420b on lower wall 416 remains intact. As such, cover 36 remains locked in place. Only when a specific positive pressure is applied to indentation 302 does a sufficient deflection occur within receptacle 410 to release pin 504 from its friction fit. This provides a "spring" to assist with the release of pin 504 from its friction fit. Other parts of interior region 404 may be moulded from the second material to provide additional cushioning. Additional grommets, gaskets or other physical features may be provided to provide additional cushioning in other embodiments.

Figure 8A:
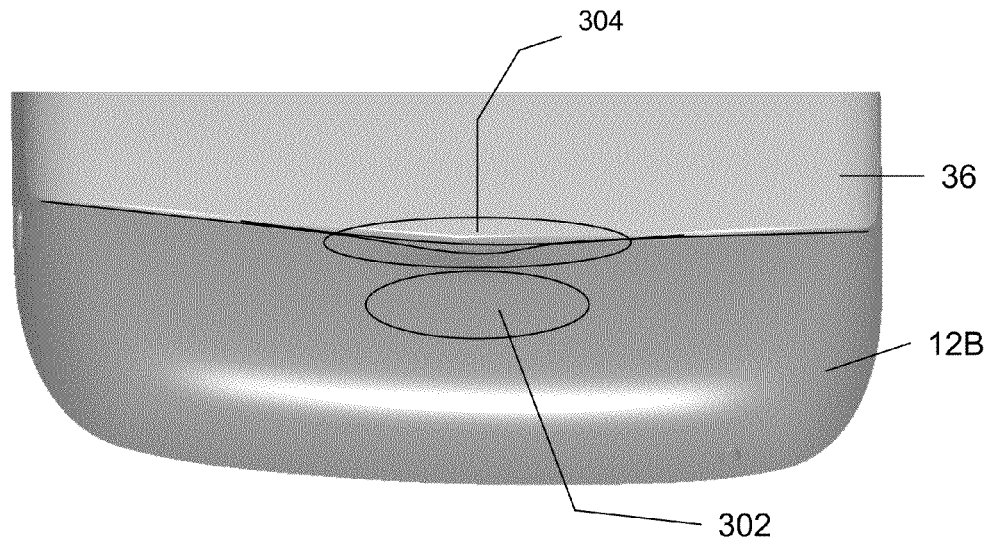
FIG. 8A is a rear plan view of part of the cover in place in the back housing of the device of FIG. 3A.
Figure 8B:
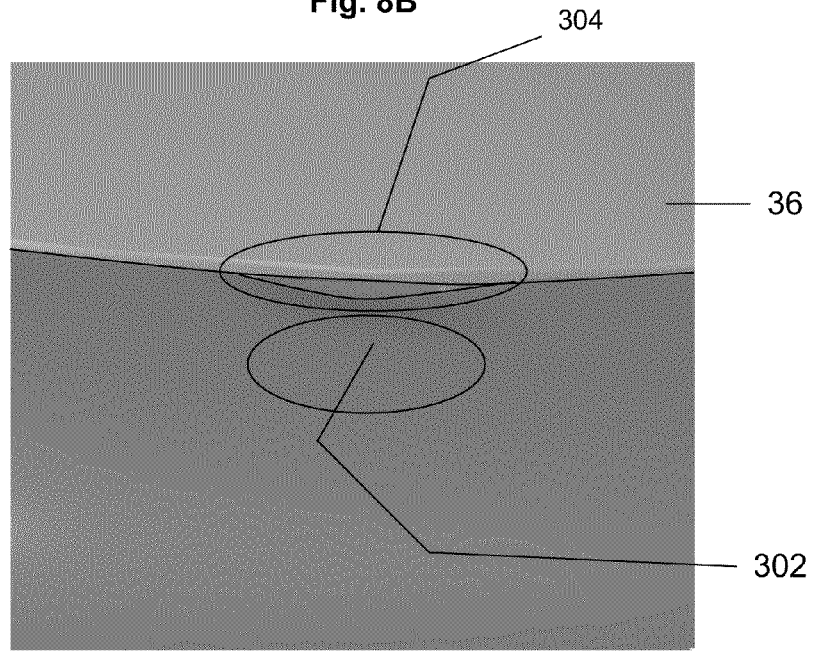
FIG. 8B is a rear plan view of part of the cover in place in the back housing of the device of 3A.

Referring to FIGS. 6, and 8A and 8B, when external inward pressure is applied to indentation 302, the area is deformed and the deformation force is translated and applied to the walls of receptacle 410. When an external inward pressure is applied to indentation 302 (noted at "A" in FIG. 6), the force is translated to upper wall 414, deflecting upper wall 414 towards the top of device 10 (noted with arrow "B" in FIG. 6). As such, protrusion 420a is moved away from pin 504. At that point, pin 504 (and cover 36) may be outwardly moved from protrusion 420b. As pin 504 moves outwardly over protrusion 420b, one or more of pin 504, upper wall 414 and/or lower wall 416 may be deflected. It will be appreciated that depending on the thickness, shape and materials of each of pin 504, walls 414 and 416 will affect how tight of a friction fit is provided when pin 504 is fully engaged into receptacle 410 and how much deflection of one or more of walls 414 and/or 416 or pin 504 is needed to allow pin 504 to be removed therefrom. Note that collar 422 and pocket 424 facilitate this deflection and allow upper wall 414 to be deflected from lower wall 416. The compliance and rigidity of the material provided for the cover and housing may be tailored to assist or resist deflections. Also note that lower wall 416 resists deflection as it is made from polycarbonate and since the location of antenna 62/64 brace its downward movement. In other embodiments, lower wall 416 may be provided to provide some deflection and/or the amount of deflection of upper wall 414 may be increased or decreased. In other embodiments, one or more predefined pressure locations may be provided on back housing 12B and/or cover 36. Therein materials and structures may be designed to translate an intended force to one or more receptacles 410 to cause the locking mechanism to disengage from pin 504 when an appropriate pressure is applied. As noted above, a user's finger can be placed on indentation 302 with the user's fingernail placed in gap 304 and a prying motion can be applied to release the locking mechanism and lift cover 36 from back housing 12B. This may be done with one hand. In another embodiment, the external force that is applied may cause a feature on cover 36 to be moved to a position to allow that feature on the cover 36 to be disengaged from a corresponding locking feature in housing 12B.

It will be appreciated that the manufacturing process for cover 36 and back housing 12B is a moulding process; in one embodiment, no other parts or components need to be welded or affixed to the pin 504 or the receptacle 410 to complete the locking mechanism. However, in alternative embodiments, an additional brace or connector may be used.

It will be appreciated that in this embodiment, the locking pin 504 and the protrusions 420a and b are arranged to require a deflection along the main axis of device 10 to release the locking mechanism. In other embodiments, a locking mechanism can be provided to require a lateral force along the transverse axis of device 10.

It will be appreciated that dimensions, materials and locations of various features for the cover, housing, locking pin, locking mechanisms may be customized for specific requirements of specific electronic devices.

While the disclosure provides details on one exemplary embodiment with one locking mechanism, it will be appreciated that in other embodiments other friction fit interfaces may be provided between a locking pin located on cover 36 and a receptacle located on back housing 12B. For example, other friction fit interfaces may be disks, domes, bumps, blocks, depressions or the like. It will be appreciated that the interaction between the locking pin 504 and the receptacle 410 provide a locking system to keep cover 36 firmly attached to back housing 12B. In other embodiments, other locking mechanisms can be provided. Generally, a locking system has one feature on either the locking pin or the receptacle which positively mates with a corresponding feature on the corresponding receptacle or pin. The features are complementary to each other. For example one feature may be a positive feature, such as a protrusion, tab, flange or the like. The complementary feature may be a negative feature, such as an aperture, void, opening, notch or the like. The two "positive" features may be offset from each other to interact. It will be further appreciated that the position, size, shape, number and locations of features may be changed, moved and reconfigured as needed. For example, in another embodiment a locking pin may be provided on the housing having features as described herein and a cover may be provided with the receptacle having features as described herein.

Further in other embodiments, the dimensions of the cited features for the locking mechanism may be changed and one or more of the materials (e.g. the walls of receptacle 410) may be changed to different materials. It will be further appreciated that the described locking mechanism can be provided for any cover for an opening of a housing of any electronic device.

The present disclosure is defined by the claims appended hereto, with the foregoing description being merely illustrative of a preferred embodiment of the disclosure. Those of ordinary skill may envisage certain modifications to the foregoing embodiments which, although not explicitly discussed herein, do not depart from the scope of the disclosure, as defined by the appended claims.

The invention claimed is:

1. A housing for an electronic device comprising:
   a back housing defining an interior compartment of the electronic device and a receptacle defined in the interior compartment, the back housing formed from a layer of elastomeric material defining an outer surface of the housing and a layer of plastic material adjacent the elastomeric material, the elastomeric material defining an indentation adjacent the receptacle, the receptacle having a first locking feature; and
   a cover removably coupled to the back housing to close the interior compartment of the back housing, the cover having a second locking feature projecting from a surface of the cover, the first locking feature of the receptacle configured to receive the second locking feature of the cover, the first locking feature movable between an engaged position with the second locking feature to prevent removal of the second locking feature from the receptacle and a disengaged position with the second locking feature to enable removal of the second locking feature from the receptacle and the cover from the back housing when an inward pressure is applied to the indentation, the second locking feature movable relative to the surface of the cover to enable the first locking feature to move to the engaged position when the second locking feature is being inserted in the receptacle.

2. A housing for an electronic device of claim 1, wherein the second locking feature is a locking pin having a projection.

3. A housing for an electronic device of claim 1, wherein the first locking feature includes a first wall protrusion formed from the elastomeric material.

4. A housing for an electronic device of claim 3, wherein the first wall protrusion is to deflect away from the second locking feature when the inward pressure is applied to the indentation to enable the first locking feature to move to the disengaged position.

5. A housing for an electronic device of claim 4, wherein the layer of plastic defining the housing forms a second wall of the receptacle, the second wall defining a second wall protrusion spaced apart from the first wall protrusion.

6. A housing for an electronic device of claim 5, wherein the back housing forms a collar extending inwardly toward the interior compartment adjacent the receptacle.

7. A housing for an electronic device of claim 6, wherein the collar is formed as part of the layer of plastic.

8. A housing for an electronic device of claim 6, wherein the second wall protrusion protrudes towards the collar.

9. An electronic device comprising:
a housing comprising:
a cover comprising a surface and a locking pin projecting from the surface, the locking pin having a projection extending laterally therefrom; and
a back housing defining an opening, the cover being coupled to the back housing so as to close the opening, the back housing having a receptacle adjacent the opening and configured to receive the locking pin, the receptacle including a first wall and a second wall spaced apart from the first wall, the first wall having a first protrusion extending toward the second wall for engaging the locking pin projection and the second wall having a second protrusion extending toward the first wall for engaging a side of the locking pin opposite the locking pin projection, the back housing being deformable in response to an inward pressure adjacent the first wall to deflect the first wall relative to the second wall to move the first protrusion in a direction away from the second wall to disengage the locking pin projection and to enable the locking pin to be withdrawn from the receptacle and the cover to be removed from the back housing.

10. The electronic device of claim 9, wherein the first wall has a first flexibility and the second wall has a second flexibility, the flexibility of the first wall being greater than the flexibility of the second wall.

11. The electronic device of claim 9, wherein the back housing comprises a layer of elastomeric material defining an outer surface of the back housing and a layer of plastic material defining an inner surface of the back housing, the layer of elastomeric material being adjacent the layer of plastic material.

12. The electronic device of claim 11, wherein the first wall is formed from the layer of the elastomeric material and the second wall is formed from the layer of the plastic material.

13. The electronic device of claim 9, wherein the back housing further comprises an indentation adjacent the receptacle, the indentation to cause the first protrusion to move away from the second protrusion to enable the locking pin of the cover to be withdrawn from the receptacle when the inward pressure is applied to the indentation.

14. The electronic device of claim 13, further comprising a gap formed between the cover and the indentation of the back housing adjacent the receptacle.

15. The electronic device of claim 9, wherein the back housing forms a collar extending inwardly toward the opening and adjacent the first wall of the receptacle, wherein the collar supports a portion of the first wall adjacent the first protrusion of the first wall.

16. The electronic device of claim 15, wherein the collar is composed of a plastic material and is integrally formed with the back housing as a unitary piece or structure.

17. The electronic device of claim 15, wherein the collar is positioned away from the first protrusion of the first wall such that the collar does not interfere with the first protrusion when the first protrusion deflects relative the second wall.

18. The electronic device of claim 15, wherein the second protrusion of the second wall protrudes towards the collar.

19. The electronic device of claim 9, further comprising a gap formed between the cover and the back housing adjacent the receptacle.

20. The electronic device of claim 19, wherein the inward pressure is applied within the gap to enable removal of the cover from the back housing.

21. The electronic device of claim 9, wherein inward pressure causes a force to be transferred to the receptacle in response to the press applied to the cover adjacent the receptacle to cause the first protrusion of the first wall to deflect away from the locking pin to enable the locking pin to be withdrawn from the receptacle.

22. The electronic device of claim 9, wherein the second protrusion of the second wall is to cause the locking pin to deflect relative to the surface of the cover and toward the first wall when the locking pin projection is inserted into the receptacle and engages the second protrusion of the second wall, the locking pin to cause the first wall protrusion to deflect away from the second wall to enable the locking pin projection to move past the second wall protrusion.

23. The electronic device of claim 9, wherein a portion of the cover rests against the first wall such that the first wall provides absorption of external shocks imparted to the cover.

24. The electronic device of claim 9, wherein the locking pin is positioned adjacent a distal end of the cover.

* * * * *